1 9 8 - 4 4 1

1 0 / 1 5 / 8 5 X R 4,546,526

United States Patent [19]

Dusel et al.

[11] Patent Number: 4,546,526

[45] Date of Patent: Oct. 15, 1985

[54] APPARATUS FOR AXIALLY SHIFTING WIRE SEGMENTS IN BELT TYPE CONVEYOR

[75] Inventors: Robert O. Dusel, Brookfield; Gerald E. Blaha, Waukesha, both of Wis.

[73] Assignee: Artos Engineering Company, New Berlin, Wis.

[21] Appl. No.: 507,239

[22] Filed: Jun. 22, 1983

[51] Int. Cl.[4] ........................ H01R 43/04; H05K 13/06

[52] U.S. Cl. .................................. 29/33 M; 29/564.4; 29/564.6; 29/564.8; 29/753; 198/341; 198/628

[58] Field of Search .................... 29/33 M, 33 P, 748, 29/753, 759, 564.4, 564.6, 564.8; 198/627, 626, 628, 341, 345

[56] References Cited

U.S. PATENT DOCUMENTS 4,230,218 10/1980 Kunzmann ...................... 198/627 X

FOREIGN PATENT DOCUMENTS 2513063 3/1983 France ................................ 29/33 P

*Primary Examiner*—Z. R. Bilinsky

*Attorney, Agent, or Firm*—James E. Nilles; Thomas F. Kirby

[57] ABSTRACT

A machine cuts elongated wire segments from a continuous wire strand. A belt type conveyor conveys each segment in incremental steps along a path, with the axis of each segment transverse thereto. The conveyor initially grips a segment near one end and presents it to a first terminal attachment machine on one side of the conveyor where a first terminal is attached. Then, separator devices cause the conveyor to temporarily release its grip on the wire segment to allow wire shifter devices, first, to axially shift the wire segment very rapidly a great distance so that the conveyor can regrip the wire segment near its other end and, secondly, to axially shift the wire segment slowly for a short distance to precisely position its opposite end in final position wherein a second terminal attachment machine on the other side of the conveyor attaches a second terminal to the opposite end. A control system comprises sensors for determining when the wire segment has been moved by the wire shifters. Each sensor comprises separable electrical contacts between which a wire segment is received and which bias closed to provide a control signal when the wire segment is withdrawn axially by a wire shifter device. The contacts of one sensor are movable near the conveyor to initially receive the drooping end of a wire segment and are movable away from the conveyor to ensure proper timing of contact closure.

18 Claims, 24 Drawing Figures

APPARATUS FOR AXIALLY SHIFTING WIRE SEGMENTS IN BELT TYPE CONVEYOR

BACKGROUND OF THE INVENTION

1. Field of Use

This invention relates generally to equipment for attaching terminals to both ends of a wire segment to form a wire lead.

In particular, it relates to such equipment having apparatus for axially shifting a relatively long wire segment in a belt type conveyor so that first one end and then the other end of the wire segment is accessible to terminal attachment machines located on opposite sides of the conveyor.

2. Description of the Prior Art

Many industries manufacture products using electrical wire leads which take the form of cut segments of insulated wire, stripped at both ends, and then provided with terminals at both of the stripped ends. The wire segments are typically manufactured on a high speed linear feed cutting and stripping machine which cuts the segments from a continuous strand of wire moving along a path. Cutting and stripping usually occur simultaneously. The cut and stripped wire segments are individually siezed and transported by conveyor means from the cutting and stripping machine to wire processing machines which perform operations such as tinning, twisting, terminal attachment and so forth on opposite ends of the segment. In the case of relatively long wire segments it was heretofore necessary to provide conveyor means which comprised a pair of laterally spaced apart chain type conveyors, each one gripping and supporting the wire segment near an end thereof. Some prior art chain type conveyors typically employ an endless chain reeved around longitudinally spaced apart sprockets and the chain is provided at intervals therealong with wire gripping devices or jaws which close and open automatically at appropriate intervals to grip and then subsequently release the wire segments conveyed. Relatively complex mechanisms are required to operate the jaws. Such prior art conveyors are costly to produce and present certain problems in use. For example, moving metal parts in the chain, jaws and operating mechanisms are subject to wear and mechanical breakdown. Further, the mass and operational characteristics of the chain and associated components impose upper limits on conveyor speed. Also, the wire gripping devices or jaws can damage the insulation of the wire section held thereby, resulting in an unsightly product or one prone to subsequent electrical failure. Efforts to line the jaws with protective surface materials add to the cost and complexity of the conveyor and its maintenance. It is desirable, therefore, to provide an improved type of conveyor and improved apparatus for use therewith to handle and process relatively long wire segments.

U.S. patent application Ser. No. 363,968 now U.S. Pat. No. 9,502,586 entitled "Belt Type Conveyor For Conveying Wire Segments" and filed Mar. 31, 1982, by R. O. Dusel and G. E. Blaha, inventors of the subject matter of the present invention, which is assigned to the same assignee as the present application and is copending herewith, discloses and claims an improved belt type conveyor for conveying wire segments and also discloses and broadly claims an embodiment thereof which is provided with apparatus for axially shifting a relatively long wire segment in a belt type conveyor so that first one end and then the other end of the wire segment is accessible to terminal attachment machines located on opposite sides of the conveyor. The shifting apparatus in Ser. No. 363,968 employed first and second shifter means (and first and second belt flight separator means), each of which shifter means employed a pair of vertically shiftable driven separable rollers for gripping and shifting a wire segment.

Since the wire segments moved along a horizontal path and the rollers rotated about vertical axes, it was necessary to employ means to vertically shift (i.e., raise and lower) the rollers to enable engagement with the wire segments. For example the first pair of rollers needed to be lowered while a wire segment moved into position thereabove, whereupon the pair of rollers (while open) were raised so that the wire segment was disposed therebetween. After this the rollers were closed to engage the wire segment, and the belt flight separated to free the segment for axial shifting by the driven rollers. After shifting the rollers were separated and again moved to lowered position to accommodate the next segment. The second pair of rollers in Ser. No. 363,968 operated in a similar manner.

SUMMARY OF THE PRESENT INVENTION

Equipment in accordance with the invention for fabricating terminated wire leads comprises: a machine to cut wire segments of desired length (about three feet, for example) from a continuous strand of insulated wire and to strip insulation from one end; a belt type conveyor comprising a driven pair of endless flexible belts having confronting flights, one above the other, periodically separable at their in-feed end for initially receiving, initially gripping the wire segments near one end and for conveying the wire segments in incremental steps along and transversely disposed to a horizontal path; at least one wire processing machine such as a terminal attachment machine along one side of the conveyor for processing the stripped end of the wire segments moving therepast as by attaching a terminal thereto; shifter apparatus adjacent the conveyor for shifting the wire segments axially and horizontally in the conveyor after the first wire processing machine has operated thereon so that the wire segments are gripped near their other end by the conveyor, and at least another, but preferably two, wire processing machine such as a stripping machine and a terminal attachment machine along the other side of the conveyor for processing the other end of the wire segments moving therepast after the segments have been axially shifted, as by stripping insulation from the other end and attaching a terminal thereto.

The shifter apparatus comprises a first separator means, a first wire shifter device or fast pull-back unit, a second separator means, a second wire shifter device or slow pull-back unit, and control means, including sensing means, to effect coordinated operation thereof. The first separator means operates to periodically separate and then reclose the confronting flights between which a wire segment is entrapped at a first location along the path to free and enable the wire segment to be axially shifted. The first wire shifter device includes a pair of rollers rotatable about horizontal axes to entrap, rapidly shift the wire segment axially for a substantial predetermined distance and then release the wire segment. At least one of the rollers is rotatably driven and they are relatively movable vertically between a separated position and a closed wire-entrapping position. The second separator means operates to periodically separate and then reclose the confronting conveyor flights between which the previously shifted wire segment is entrapped at a second location along the path to free and enable this wire segment to be further shifted axially. The second wire shifter device includes a clamp to grasp, slowly shift the wire segment axially for a small distance to precisely position it in a final predetermined position and then release the wire segment. The clamp is reciprocably movable horizontally and is also movable between an open wire-release position and a closed wire-gripping position.

The sensing means comprises a first sensor device which senses when the wire segment is fully shifted by the first wire shifter device and then provides an electric signal to initiate the following operations: separation of the pair of rollers to release the wire segment; and reclosure of the separated flights at the first location to regrip the wire segment and enable further conveyance. Operation of the second separator means to free the previously shifted wire for further shifting and operation of the second wire shifter device to precisely position the segment is effected by the control means. The second sensor device senses when the wire segment is precisely and finally positioned and provides an electrical signal to initiate the following operations: stoppage of clamp movement, release of the clamp and reclosure of the separated flights at the second location to regrip the wire segment and enable further conveyance. Each sensor device comprises a pair of vertically separable members (actually electric switch contacts) which clamp down on a wire segment moved therebetween by the conveyor and close (make electric contact) when the wire segment is axially withdrawn from therebetween by a wire shifter device to provide an electric control signal used to ensure synchronized operation of system components. The first sensor device is adapted to take into account the fact that the longer end of a wire segment initially extending from the other side of the conveyor tends to droop downwardly under the force of gravity. It would be difficult to direct the drooping portion between the open members of the first sensor device by the conveyor, especially if the first sensor device is located some distance (i.e. about one-half foot) from the side of the conveyor where it needs to be located in order to ensure production of an electrical signal at an appropriate time, in view of the fact that the wire segment is being axially shifted very rapidly and would overrun or be completely withdrawn from the side of the conveyor by the first wire shifter if the latter is not signalled to stop axial movement early enough to prevent wire segment withdrawal.

Shifter apparatus in accordance with the present invention embodies several features and improvements over the prior art and over that disclosed and claimed in our co-pending U.S. patent application Ser. No. 363,968 and offers several advantages thereover. For example, in the present invention the pair of rollers in the first wire shifter device rotate on axes parallel to the conveyor path and a conveyed wire segment is readily moved between the separated rollers without the need to raise and lower or otherwise position the rollers, as in our co-pending application, to be ready to receive the wire segments. This simplifies the equipment and reduces costs. Further, in the present invention only one roller is rotatably driven, thus reducing complexity and cost. In the present invention, a clamp is used in the second wire shifter device to precisely position the wire segment for terminal attachment purposes, instead of another pair of separable rollers as in our co-pending application. While rollers offer the advantage of speed in axial shifting, they are difficult to control precisely. Thus, the present invention is less complex, more reliable in use and less costly to manufacture as regards the aforementioned features. In addition, the control means in the present invention employs a pair of sensors which are directly responsive to actual wire segment positions to initiate synchronized operation of system components, thus insuring more accurate sensing and enabling higher operational speeds. Other objects and advantages of the invention will hereinafter appear.

DRAWINGS

DEESCRIPTION OF A PREFERRED EMBODIMENT

General Arrangement

Figure 1:
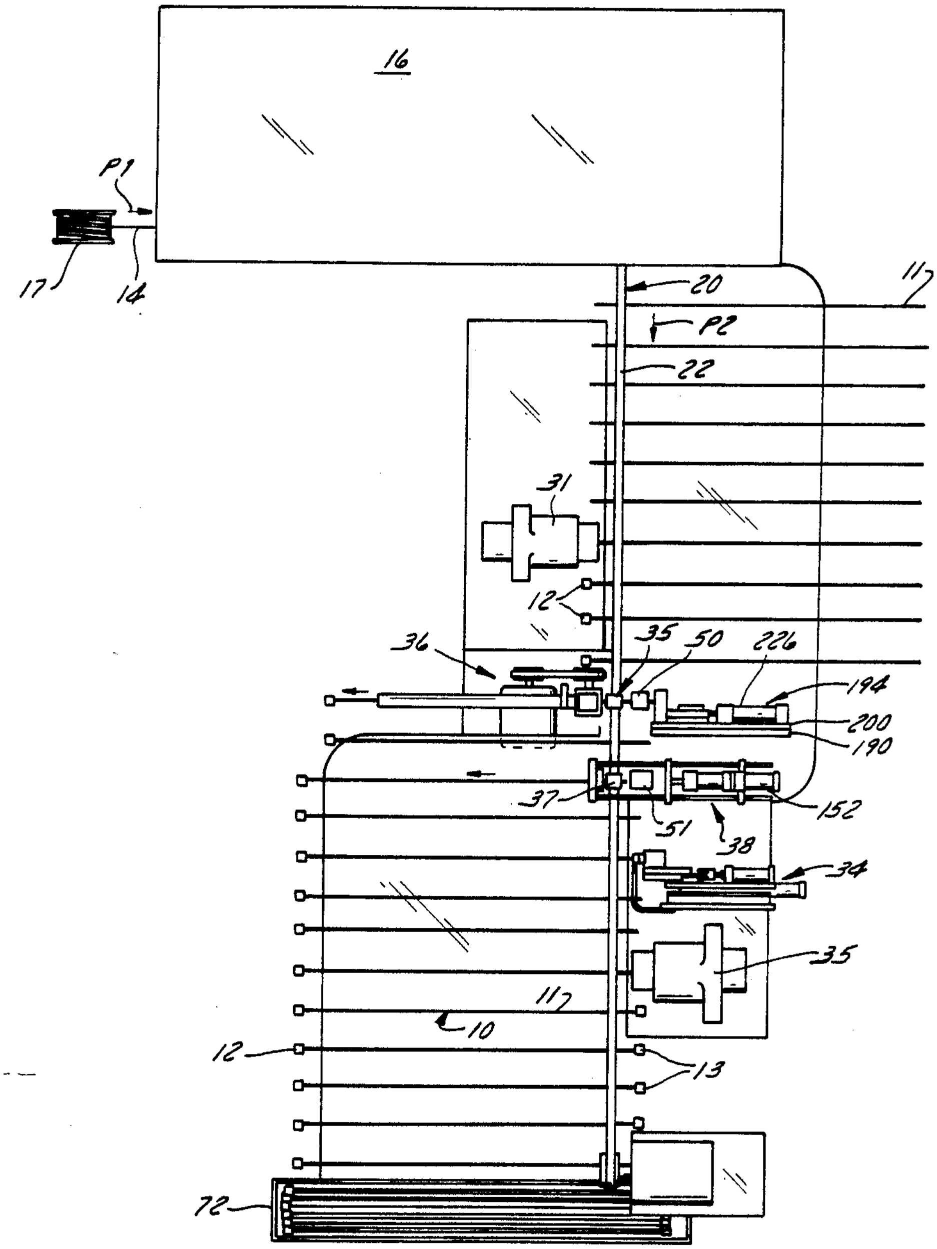
FIG. 1 is a top plan schematic view of equipment in accordance with the invention for fabricating terminated wire leads and including a cutting and stripping machine, a belt type conveyor, terminal attachment machines, a stripper and shifter apparatus.

FIG. 1 shows in schematic form a top plan view of equipment in accordance with the present invention for fabricating wire leads, such as a wire lead 10 which comprises a wire segment 11 and electrical terminals 12 and 13 at opposite ends thereof. Each wire segment 11 is cut from a continuous strand 14 of insulated wire and insulation is stripped from opposite ends of the wire segment prior to attachment of the terminals 12 and 13, as hereinafter explained.

Figures 3, 4:
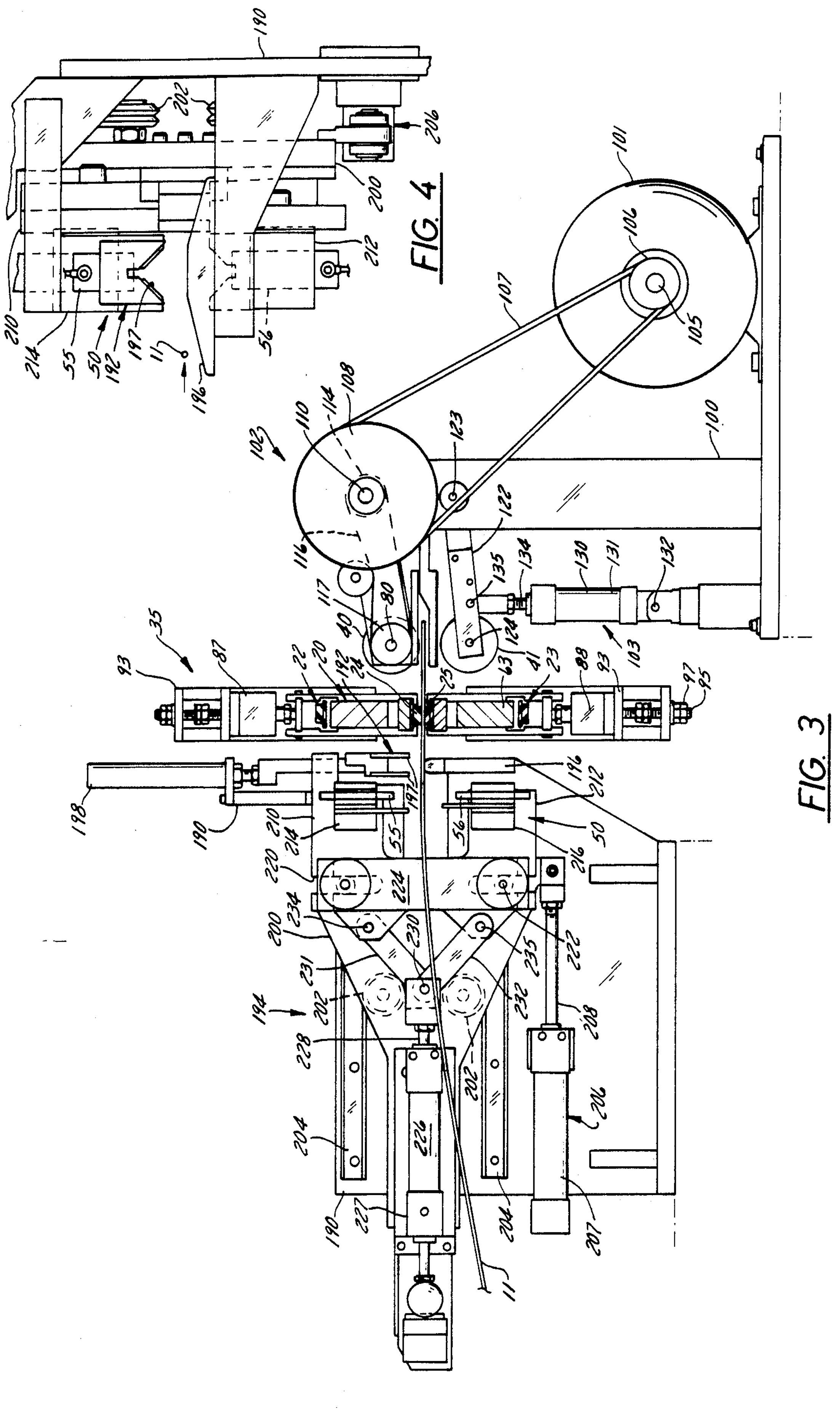
FIG. 3 is a side elevation view, partly in section, of the shifter apparatus taken on line 3—3 of FIG. 2 and showing the fast pull-back device and the first separator device closed.
FIG. 4 is an end elevation view of the shifter apparatus (fast pull-back device) taken on line 4—4 of FIG. 2.

The equipment comprises a wire cutter and stripper machine 16 for drawing the wire strand 14 from a reel 17 along a path P1 and for repeatedly cutting segments 11 of desired length therefrom (about 3 feet, for example) and for stripping one end. The equipment further comprises a belt type conveyor 20 for receiving the wire segments 11 and conveying them in spaced apart relationship and in incremental steps along a path P2 (transverse to path P1) for further processing. As FIG. 3 shows, conveyor 20, hereinafter described in detail, comprises a driven pair of endless flexible belts 22 and 23 having confronting flights 24 and 25, respectively, between which the wire segments 11 are inserted and entrapped for transport. Each wire segment 11 has its axis disposed transversely to path P2 as it moves therealong and opposite ends of the segment project from opposite sides of conveyor 20.

The equipment also comprises wire processing machines which are arranged along both sides of the conveyor 20 to process the ends of the wire segments 11 moving therepast. These machines include a first terminal attachment machine 31 on one side of conveyor 20 for attaching a wire terminal 12 to one stripped end of each wire segment 11. These machines also include a second wire stripper machine 34 and a second terminal attachment machine 35 on the other side of conveyor 20 for stripping the other end of each wire segment 11 and attaching a wire terminal 13 thereto.

Each wire segment 11 is usually relatively long and in some prior art systems would be carried by a conveyor means (not shown) which comprises a pair of side-by-side conveyors (not shown), each supporting one end of a wire segment. In the present invention, however, each wire segment 11 is initially gripped near one end by conveyor 20 until the first terminal attachment machine 31 acts thereon and then is shifted axially (leftward with respect to FIG. 1) in the conveyor 20 by the shifter apparatus in accordance with the invention so that the segment is subsequently gripped near its other end by the conveyor 20 so that the second wire stripper machine 34 and the second terminal attachment machine 35 can act on the other end of the wire segment. Gripping each wire segment 11 first near one end and then near the other end virtually eliminates possible downward drooping of that free end of the wire segment which is to be processed and simplifies alignment of the segment end with the processing machines.

Figure 2:
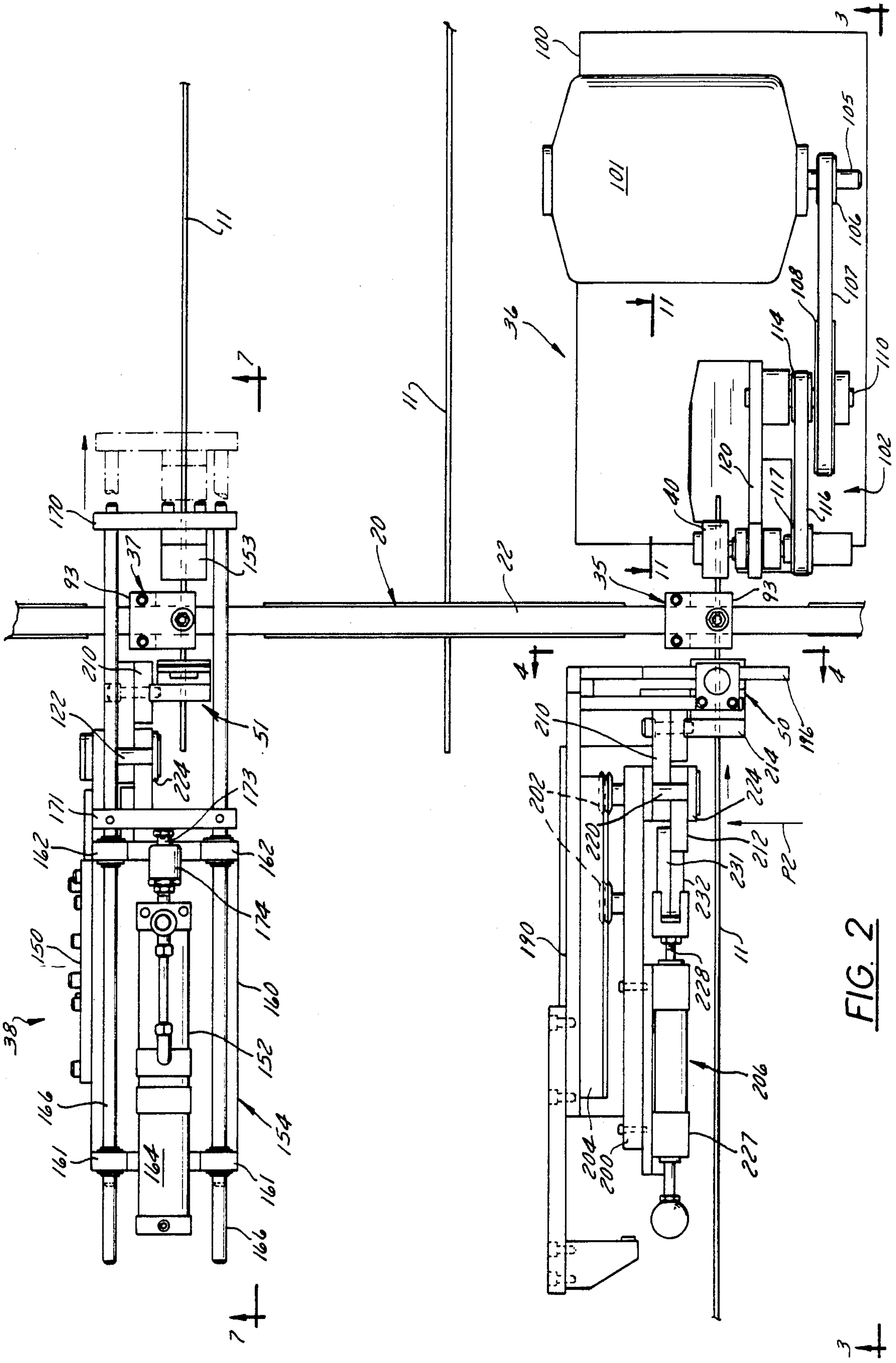
FIG. 2 is an enlarged top plan view of the shifter apparatus of FIG. 1.
Figures 5, 6:
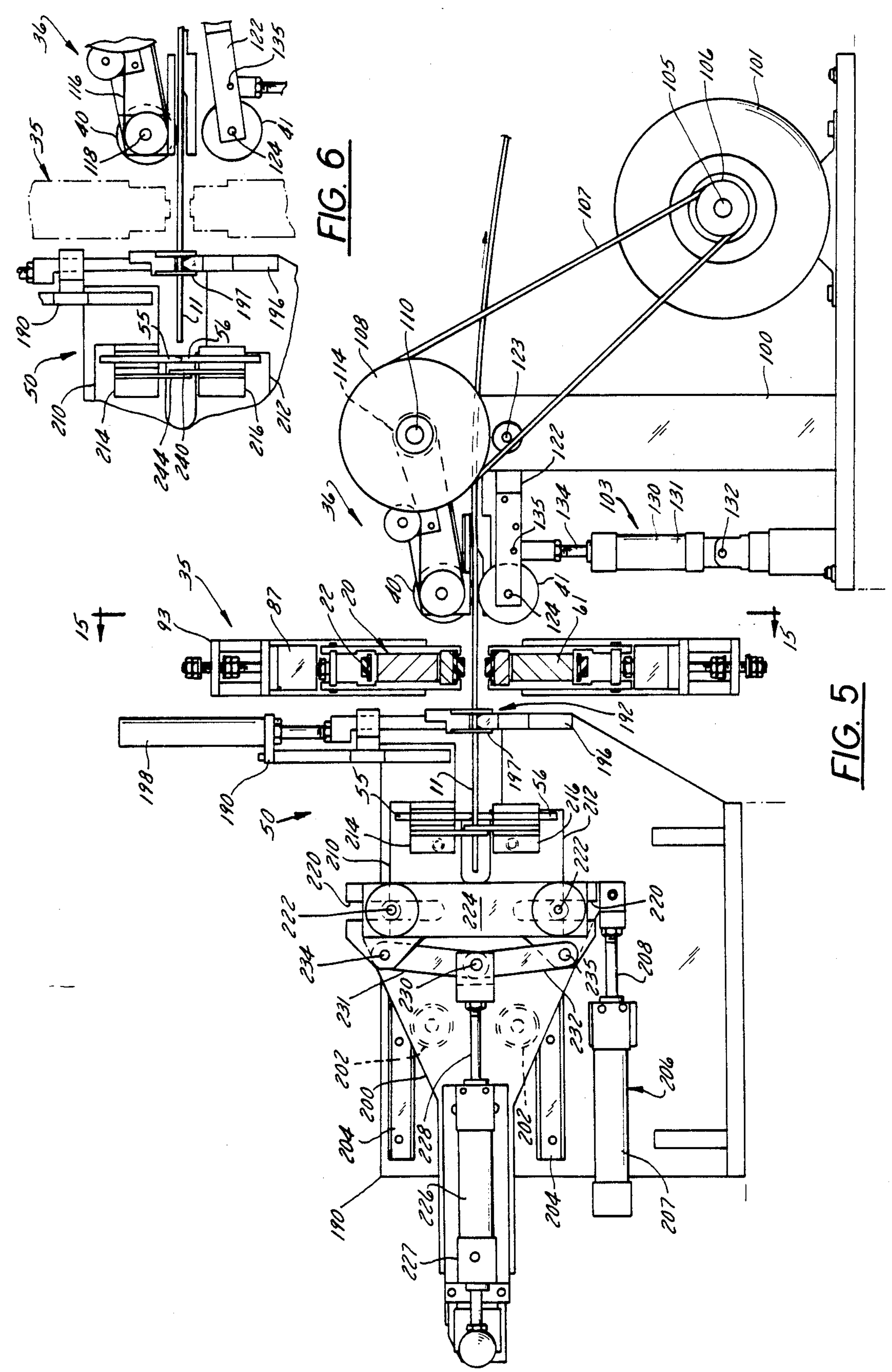
FIG. 5 is a view similar to FIG. 3 but showing the first separator device open.
FIG. 6 is a view similar to FIG. 5 but showing a wire segment in a different position and the first separator device open.

The shifter apparatus comprises a first belt flight separator means 35, a first wire shifter device or fast pull-back unit 36, a second belt flight separator means 37, a second wire shifter device or slow pull-back unit 38, and control means, including sensing means, hereinafter described, to effect coordinated operation thereof. As FIGS. 2, 3 and 5 show, the first separator means 35 operates to periodically separate and then reclose the confronting conveyor flights 24 and 25 at a first location between which a wire segment 11 is entrapped to free and enable the wire segment 11 to be axially shifted. The first wire shifter device 36 includes a pair of rollers 40 and 41 to entrap, rapidly shift the wire segment axially (leftward in FIG. 1) for a substantial predetermined distance and then release the wire segment. At least one of the rollers, such as roller 40, is rotatably driven and bottom roller 41 is movable between a separated position (FIG. 5) and a closed wire-entrapping position (FIG. 3). As FIGS. 2, 7, 8 and 9 show, the second separator means 37 operates to periodically separate and then reclose the confronting conveyor flights 24 and 25 at a second location between which the previously shifted wire segment 11 is entrapped to free and enable this wire segment 11 to be further shifted axially (leftward in FIG. 1). The second wire shifter device 38 includes a clamp 44 to grasp, slowly axially shift the wire segment 11 for a small predetermined distance (leftward in FIG. 1) to precisely position it and then release the wire segment 11. The clamp 44 is movable between an open position (FIGS. 7 and 8) and a closed wire-gripping position (FIG. 9).

The sensing means sense when the wire segment 11 is fully shifted by the first wire shifter device 36 and then effects separation of said rollers 40 and 41 of the first wire shifter device 36 to release the wire segment 11; effects reclosure of the first separator means 35; effects operation of the second separator means 37 to free the previously shifted wire segment 11 for further shifting; effects operation of the second wire shifter device 38 to precisely position the wire segment 11; and effects reclosure of the second separator means 37. The sensing means comprises electric switch means, including two switch assemblies or sensors 50 (FIGS. 3, 4, 5 and 6) and 51 (FIGS. 7, 8 and 10), each comprising a pair of electrically conductive contacts 55, 56 which are maintained open by a wire segment 11 therebetween and which close when the wire segment 11 is withdrawn from therebetween by a wire shifter device 36 and 38. Closure of the contacts 55, 56 in the sensors 50 and 51 controls coordinated operation of the components in the shifter apparatus.

The several components in the equipment hereinbefore identified are hereinafter described in more detail.

The Wire Cutter and Stripper Machine

The wire cutter and stripper machine 16 may, for example, take the form of a wire cutter and stripper machine 10 shown in our co-pending U.S. patent application Ser. No. 363,968 which resembles a Model CS-26 machine available from Artos Engineering Company, 15600 West Lincoln Avenue, New Berlin, Wis. 53151, U.S.A. Such a wire cutter machine is understood to include a supporting cabinet, wire measuring means, wire feed means, wire cutter means, wire stripper means, drive means and programmable control means.

The Conveyor

The belt-type conveyor 20 may, for example, be similar to that shown in and described in our co-pending U.S. patent application Ser. No. 363,968. As FIGS. 1, 2, 3, 5, 15, 16 and 17 make clear, conveyor 20, which has an infeed end and a discharge end, generally comprises a supporting framework or base table 60, and has belt support means on the framework for rotatably supporting the pair of intermittently driven endless flexible belts 22 (upper) and 23 (lower) between which the wire segments 11 are inserted and entrapped and by which the segments are conveyed. The belts 22 and 23 are supported so that upper flight 25 on lower belt 23 closely confronts lower flight 24 on upper belt 22. The belt support means comprise upper and lower belt support assemblies 62 and 63, respectively. Each belt assembly 62, 63 comprises an elongated main guide rail 64. Lower guide rail 64 is rigidly secured to the base table 60. Upper guide rail 64 is adjustably positionable by a bolt (not shown) and biased downwardly on framework 60 by a spring (not shown). Each belt assembly comprises a pivotably movable guide rail end portion (not shown) which is forced against the infeed end (not shown) of its guide rail 64 by the belt 22 or 23.

Each guide rail 64 rotatably supports a drive pulley or sprocket (not shown) at one end and an idler pulley or sprocket (not shown) at its other end.

Figure 17:
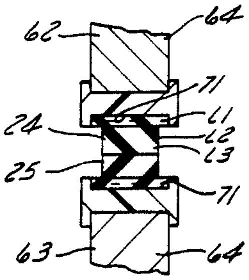
FIG. 17 is a cross-section view taken on line 17—17 of FIG. 15.

As FIG. 17 best shows, each guide rail 64 includes a slot or groove 71 in which its associated belt rides. Furthermore, each belt 22, 23 is constructed and disposed on its rail so that the confronting flights 24 and 25 are biased toward and into engagement with each other so as to ensure that the wire segments 11 are firmly gripped therebetween. Each belt 22, 23 comprises a notched sprocket-engaging layer L1 (FIG. 17) constructed of polyurethane, for example, an easily compressible middle layer L2 formed of sponge rubber or the like and bonded to layer L1; and an easily compressed outer wire-segment engaging layer L3 bonded to layer L2 and formed of gum rubber or similar material such as Buna N material.

Means (not shown) are provided for driving the belts 22, 23 so that the confronting flights move simultaneously at the same speed and in the same direction along path P2 in steps or increments and convey the wire segments 11 entrapped therebetween to the processing machines and subsequently to the discharge container 72. In operation, the drive means operates in synchronism with the operation of cutter and stripper machine 16 so that the belts 22, 23 are stopped while a wire segment 11 is received therebetween and then start up to move the wire segment a predetermined distance, whereupon the belts again stop.

The Wire Stripper Machine

The wire stripper machine 34 may take the form of any one of several commercially available wire stripper machines which remove a predetermined length of insulation from an end of a wire segment 11 to expose an end portion of the electrical conductor therewithin. A model wire stripper machine available from the aforementioned Artos Engineering Company would be suitable.

The Terminal Attachment Machines

The terminal attachment machines 31 and 35 may each take the form of any one of several commercially available terminal attachment machines which automatically feed and connect a wire terminal such as 12, 13, as by crimping, to the stripped end of a wire segment 11. A model terminal attachment machine available from the aforementioned Artos Engineering Company would be suitable.

The Shifter Apparatus

The first and second belt flight separator means 35 and 37, respectively, are the same in construction and mode of operation and, therefore, only the first means 35 is hereinafter described in detail. The first separator means 35 is shown in closed position in FIGS. 3 and 17 and in open position in FIGS. 5, 15 and 16. The second separator means 37 is shown in closed position in FIG. 7 and in open position in FIG. 9.

Figure 16:
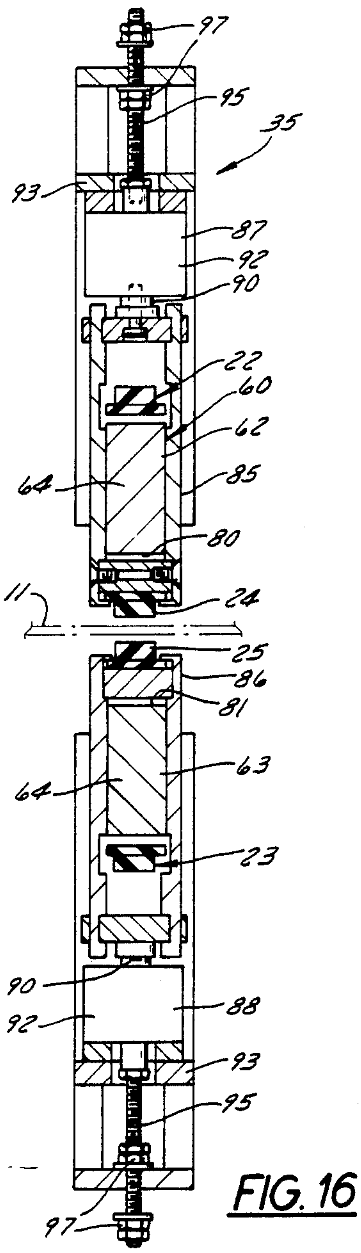
FIG. 16 is a cross-section view taken on line 16—16 of FIG. 15.
Figure 15:
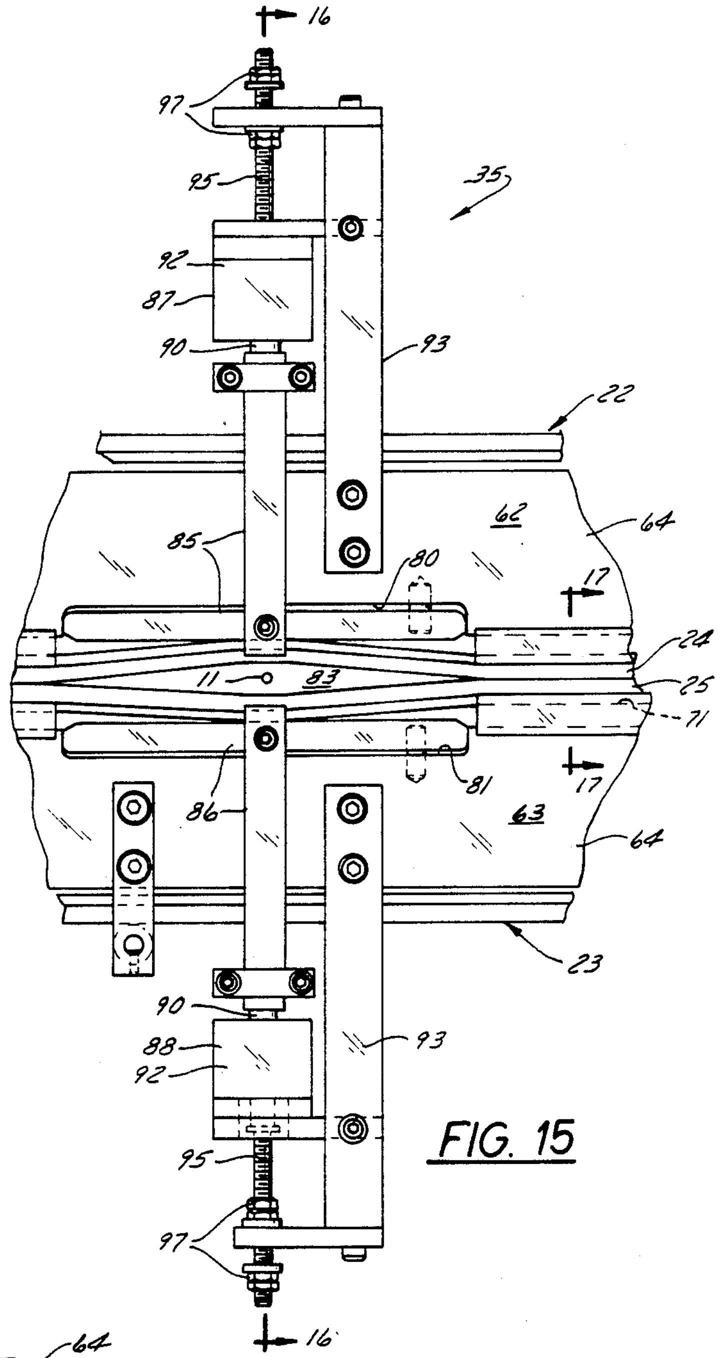
FIG. 15 is an enlarged side elevation view of the second separator means of FIG. 7.

As FIGS. 15 and 16 best show, the first flight separator means 35 comprises depressions 80 and 81 in the upper and lower guide rails 62 and 63, respectively, across which the upper and lower belt flights 24 and 25, respectively, extend. Means are provided to deflect or draw the belt flights 24 and 25 into their respective depressions 80 and 81 so that a gap 83 is produced therebetween and the wire segment 11 is free to be shifted axially in the gap. Such means comprise upper and lower flight-engaging members 85 and 86, respectively, which are shiftably movable vertically by pneumatic acutators 87 and 88, respectively. Each actuator 87, 88 comprises a piston rod 90 connected to move member 85 or 86 and a cylinder 92 which is rigidly secured to a bracket 93 which in turn is rigidly connected to a guide rail 63, 62. Each piston rod 90 is connected to a threaded adjustment screw 95 which carries adjustably positionable lock nut assemblies 97 which limit vertical belt flight travel.

The first wire shifter device or fast pull-back unit 36 is located directly adjacent the first flight separator means 35, as FIGS. 1, 2 and 3 show. FIGS. 3 and 6 show the rollers 40 and 41 of unit 36 in open position and FIG. 5 shows them in closed position.

As FIGS. 1, 2, 3, 5, 6, 11, 12, 13, 14 show, unit 36 comprises a rigid stationary supporting framework 100 adjacent conveyor 22 on which are mounted an electric drive motor 101, a roller drive assembly 102, and a roller actuator assembly 103. Motor 101 comprises a drive shaft 105 on which a pulley 106 is mounted and the latter is connected by an endless flexible drive belt 107 to roller drive assembly 102. Roller drive assembly 102 comprises a pulley 108 (driven by belt 107) which is mounted on and rotatably drives a shaft 110 which is rotatably mounted on bearings 111 on support 100. A pulley 114 is mcunted on and rotated by drive shaft 110 and is connected by a drive belt 116 to a pulley 117 which is mounted on and rotatably drives a shaft 118 which is rotatably mounted on a bearing 119 on a first roller support arm 120. Support arm 120 is rigidly mounted as by welding (FIGS. 11 and 13) in a fixed position on framework 100. Roller 40 is mounted on and rotatable by shaft 118 in response to operation of electric motor 101. The roller actuator assembly 103 comprises a second roller support arm 122 which has one end pivotably connected to framework 100 by a pivot pin 123 and which has the roller 41 rotatably mounted on its other end by a pin 124. Roller support arm 122 is movable between a raised (closed) position (FIG. 11) wherein a wire segment 11 is entrapped and frictionally engaged between the rollers 40 and 41 and a lowered (open) position (FIG. 3) wherein a wire segment 11 is untrapped between the rollers. Roller support arm 122 is movable by means of a pneumatic actuator 130 which has its cylinder housing 131 pivotably connected to framework 100 by a pin 132 and has its piston rod 134 pivotably connected by a pin 135 to roller support arm 122.

Figure 8:
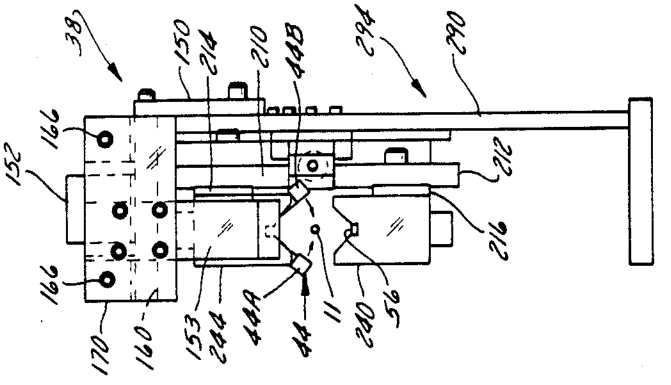
FIG. 8 is an end elevation view of the shifter apparatus (slow pull-back device) taken on line 8—8 of FIG. 7.
Figure 7:
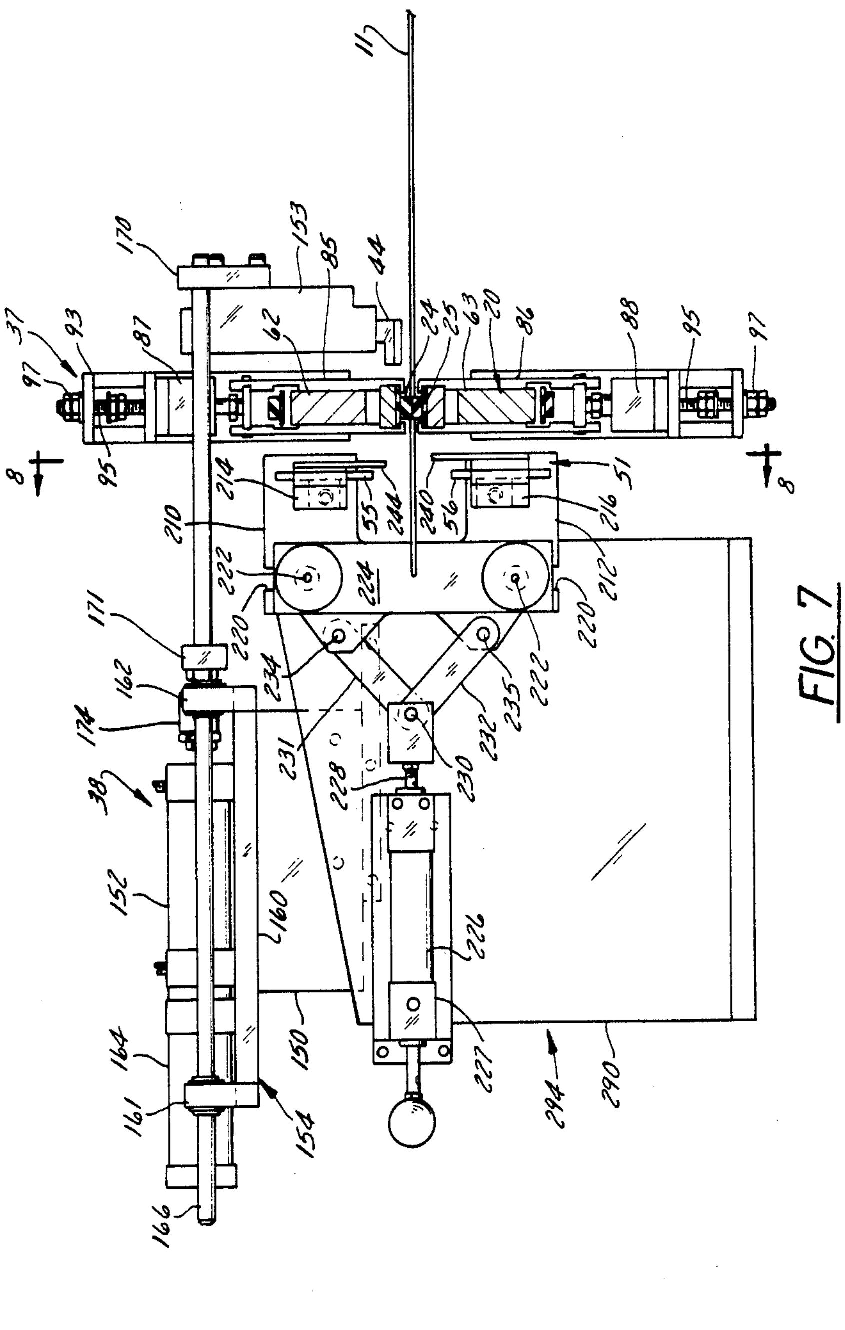
FIG. 7 is a side elevation view, partly in section, of the shifter apparatus taken on line 7—7 of FIG. 2 and showing the slow pull-back device and the second separator device closed.
Figure 9:
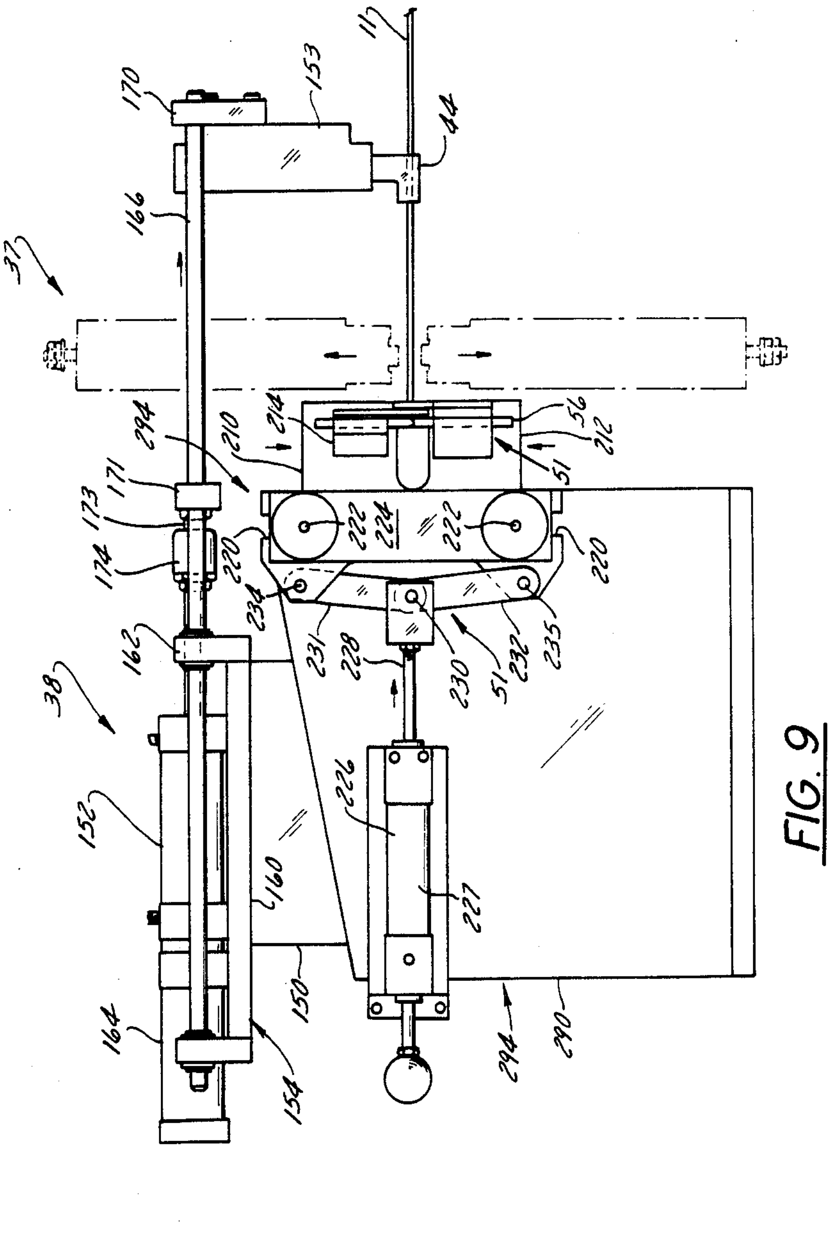
FIG. 9 is a view similar to FIG. 7 but showing the slow pull-back device in a different position and the second separator device open.
Figure 11:
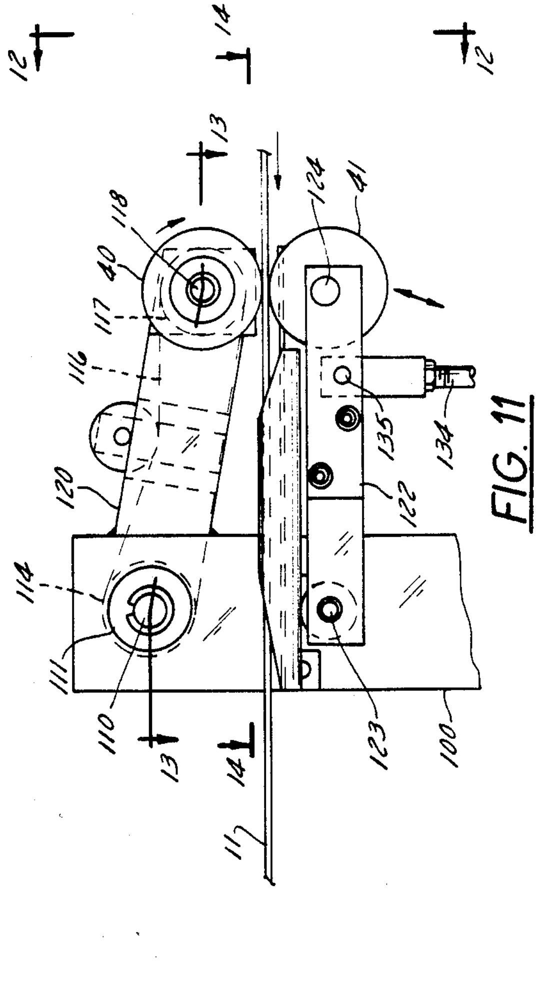
FIG. 11 is an enlarged side elevation view of a portion of the fast pull-back device taken on line 11—11 of FIG. 2.
Figure 12:
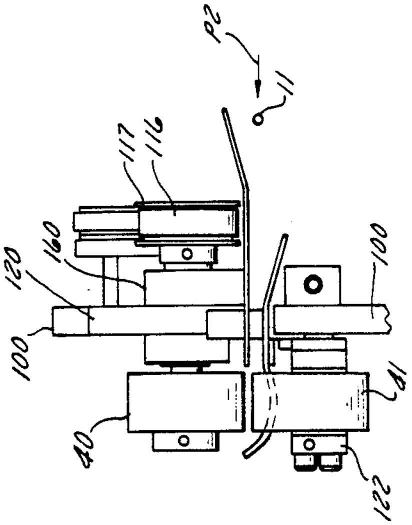
FIG. 12 is an end elevation view taken on line 12—12 of FIG. 11.
Figure 13:
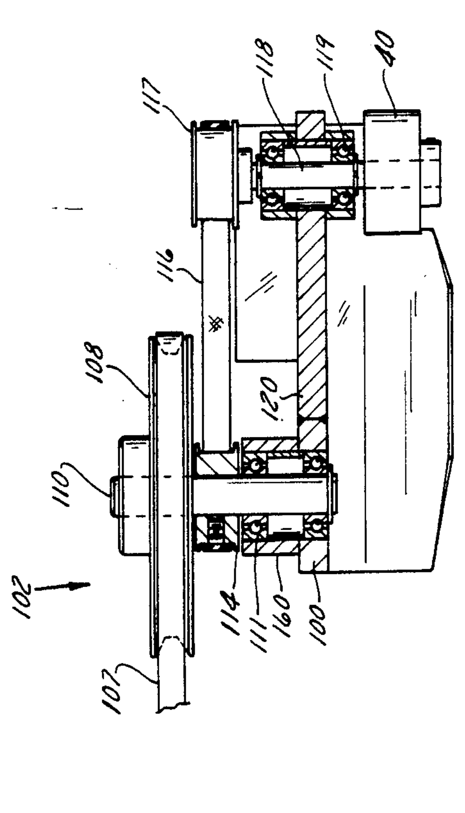
FIG. 13 is a top plan view, partly in section, taken on line 13—13 of FIG. 11.
Figure 14:
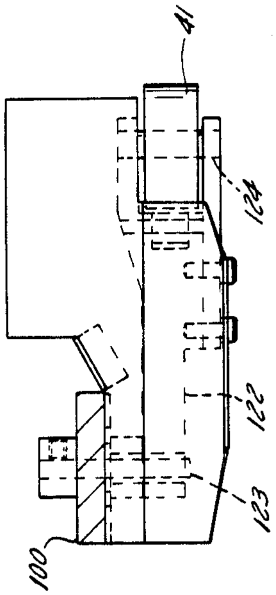
FIG. 14 is a plan view taken on line 14—14 of FIG. 11.

As FIGS. 1, 2, 7, 8 and 9 show, the second wire shifter device or slow pull-back unit 38 is located directly adjacent the second flight separator means 37. FIGS. 7 and 8 show the clamp 44 of unit 38 open and in fully retracted (or starting) position. FIG. 9 shows the clamp 44 of unit 38 closed and in fully extended (or end) position. Unit 38 comprises a rigid stationary supporting framework 150 on which are mounted a pneumatic drive motor or ram 152, a clamp actuator 153, and a support assembly 154 for slidably supporting the actuator to enable it to be shifted from fully retracted position (FIG. 7) to fully extended position (FIG. 9). Clamp actuator 153 supports and operates clamp 44 whose movable clamp members 44A and 44B have an open position (FIG. 8) and a closed position (FIG. 9). Support assembly 154 includes a base plate 160 which is rigidly secured on framework 150 and which is provided with a pair of rear guides 161 and a pair of forward guides 162. Base plate 160 also rigidly supports the housing 164 of pneumatic ram 152. A pair of rods 166 are provided and each is slidably supported on a rear guide 161 and a forward guide 162. The rods 166 are interconnected to each other by a forward yoke 170 and a rear yoke 171 and the latter is connected to the outer end of the piston rod 173 of ram 152. A self-aligning coupling 174 is provided near the outer end of piston rod 173. As ram 152 extends and retracts, the rods 166 and the actuator 153 carried thereby are correspondingly shifted. It is to be understood that actuator 153 embodies therewithin pneumatic actuator means (not shown) to effect pivotal (open/close) movement of the clamp members 44A and 44B which are pivotally mounted on actuator 153.

The switch assemblies or sensors 50 and 51 are shown in FIGS. 3, 4, 5, 6, 18, 19, 20, 21, and in FIGS. 7, 8, 10, 22, 23, 24, respectively. Sensor 50 detects when a wire segment 11 is fully shifted by fast pull-back unit 36 and initiates or permits initiation of opening operation of the rollers 40 and 41 and reclosure of the first belt flight separator device 35. Sensor 51 detects when a wire segment 11 is fully shifted by slow pull-back unit 38 and initiates or permits initiation of reclosing operation of the second belt flight separator device 37 and unclamp-/retract operation of slow pull-back unit 38. Only when these operations are complete are conveyor 20 and machine 16 enabled to perform their next successive operations.

Sensor 50 comprises a stationary supporting framework 190, a wire guide assembly 192 on the framework, and a sensor switch assembly 194 on the framework. As comparison of FIGS. 3 and 5 show, wire guide assembly 192 serves to close and correctly position and guide a wire segment 11 when the belt flights 24 and 25 are separated. Wire guide assembly 192 comprises a stationary guide member 196, a pair of movable slotted guide members 197, and a pneumatic motor 198 on framework 190 operable for moving movable guide members 197 between open (FIG. 3) and closed (FIG. 5) position.

As comparison of FIGS. 3 and 5 further show, the sensor switch assembly 194 comprises a plate 200 which is mounted for shiftable fore and aft movement relative to framework 190 by means of rollers 202 rotatably mounted on plate 200 which ride on roller guides 204 mounted on framework 190. Plate 200 is shiftably movable horizontally (with respect to FIGS. 3 and 5) by a pneumatic ram 206 which has its cylinder housing 207 rigidly secured to framework 190 and has the end of its piston rod 208 connected to plate 200. The sensor switch assembly 194 further comprises upper and lower switch support plates 210 and 212, respectively, on which switch contacts 55 and 56, respectively, are mounted by means of electrically insulating structures 214 and 216 (FIGS. 18, 19, 20, 21), respectively. The support plates 210 and 212 are mounted for sliding movement in opposite directions relative to each other in a vertical direction (with respect to FIGS. 3 and 5). Each support plate 210, 212 comprises a pair of vertically spaced apart slots, such as 220, which accommodate spaced apart guide pins or bolts, such as 222, which are affixed to a pair of face plates 224 which secure the support plates 210 and 212 in face-to-face sliding relationship. The plates 210 and 212 are shiftably movable by means of a pneumatic ram 226 which has its cylinder housing 227 rigidly secured to plate 200 and has the end of its piston rod 228 pivotally connected by a pivot pin 230 to one end of a pair of links 231 and 232. The other ends of the links 231 and 232 are connected by pivot pins 234 and 235, respectively, to the shiftable support plates 210 and 212, respectively. When ram 226 is fully retracted (FIG. 3) the contacts 55 and 56 are fully separated. When ram 226 is fully extended, the contacts 55 and 56 either engage a wire segment 11 (FIG. 5) or, when the wire segment 11 is fully shifted, engage and make electrical contact with each other (FIG. 6).

The reason for shifting plate 200 between its fore and aft positions is as follows. FIG. 3 shows that the short end of wire segment 11 initially enters between the open rollers 40 and 41 without difficulty because of the stiffness of the wire segment. However, the long end of wire segment 11 tends to droop down under the force of gravity and would be difficult to direct between the open contacts 55 and 56 of sensor 50 unless a relatively horizontal portion of the wire segment (i.e., a portion near the side of conveyor 20) is directed between the contacts. However, because of the speed with which segment 11 is shifted by the rollers 40 and 41 when the latter are closed (see FIG. 5), the end of segment 11 would be withdrawn from between the contacts 55 and 56 too soon to enable contact closure and timely initiation of an appropriate control function before the wire segment was pulled completely out of the conveyor 20. To prevent this, plate 200 is shifted leftward (compare FIGS. 3 and 5) to move the contacts 55 and 56 leftward so that contacts 55 and 56 close sooner than would otherwise be the case.

Figure 10:
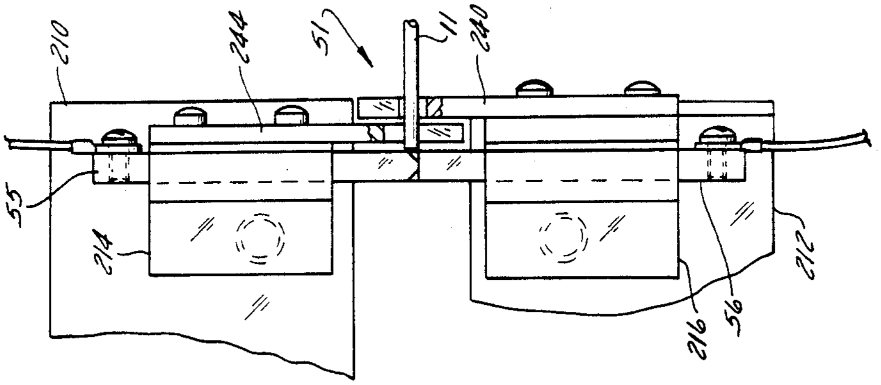
FIG. 10 is a greatly enlarged view of an electric switch shown in FIG. 9.

Sensor 51 comprises a stationary supporting framework 290 and a sensor switch assembly 294. As FIGS. 7 and 9 show, the sensor switch assembly 294, like sensor 50, comprises upper and lower switch support plates 210 and 212, respectively, on which switch contacts 55 and 56, respectively, are mounted by means of electrically insulating structures 214 and 216, respectively. The support plates 210 and 212 are mounted for sliding movement in opposite directions relative to each other in a vertical direction (with respect to FIGS. 7 and 9). Each support plate 210, 212 comprises a pair of vertically spaced apart slots, such as 220, which accommodate spaced apart guide pins or bolts, such as 222, which are affixed to a pair of face plates 224 which secure the support plates 210 and 212 in face-to-face sliding relationship. The plates 210 and 212 are shiftably movable by means of a pneumatic ram 226 which has its cylinder housing 227 rigidly secured to plate 290 and has the end of its piston rod 228 pivotally connected by a pivot pin 230 to one end of a pair of links 231 and 232. The other ends of the links 231 and 232 are connected by pivot pins 234 and 235, respectively, to the shiftable support plates 210 and 212, respectively. When ram 226 is fully retracted (FIG. 7), the contacts 55 and 56 are fully separated. When ram 226 is fully extended, the contacts 55 and 56 either engage a wire segment 11 or, when the wire segment 11 is fully shifted, engage and make electrical contact with each other (FIGS. 9 and 10).

The Control Means

The control means for operating the present equipment include the hereinbefore-mentioned programmable control means in the cutter and stripper machine 16 which effect operation thereof, as well as coordinated operation of the conveyor 20, so that wire segments 11 are received by the conveyor in properly spaced apart relationship and then advanced in appropriate incremental steps by the conveyor to the various wire processing machines and to the components in the shifter apparatus. The control means is programmed to recognize when a properly positioned wire segment 11 has reached the first belt flight separator means or device 35 (i.e., a first location). When this occurs, the device 35 operates to separate the belt flights at the first location. The control means is also programmed to recognize when the first belt flight separator device 35 is open and to initiate operation of the first wire shifter device or fast pull-back unit 36 and effecting closure of the rollers 40 and 41 so that the freed wire segment 11 is gripped therebetween and axially shifted.

The switch assemblies or sensors 50 and 51 shown in FIGS. 3, 4, 5 and 6 and in FIGS. 7, 8 and 10, respectively, are part of the control means hereafter described and operate as follows. When unit 36 closes its rollers 40 and 41 to grip the wire segment 11 therebetween, the sensor 50 operates simultaneously therewith to cause its relatively movable contacts to move together and grip wire segment 11 and then shift leftward.

As FIGS. 18, 19, 20 and 21 show, lower contact 56 is rigidly secured to a support block 216 and rigidly secured to plate 212. A V-notched wire guide plate 240 is mounted on block 216 to guide a wire segment 11 relative to contact 56. Upper contact 55 is resiliently or movably mounted by means of a spring 242 in a slot 243 in contact 55, which slot 243 receives a projection 215 on support block 214 which is made of insulating material and rigidly secured to plate 216 by suitable means. A V-notched wire guide plate 244 is mounted on block 216 to guide a wire segment 11 relative to movable contact 55.

Figures 18, 19, 20, 21, 22, 23, 24:
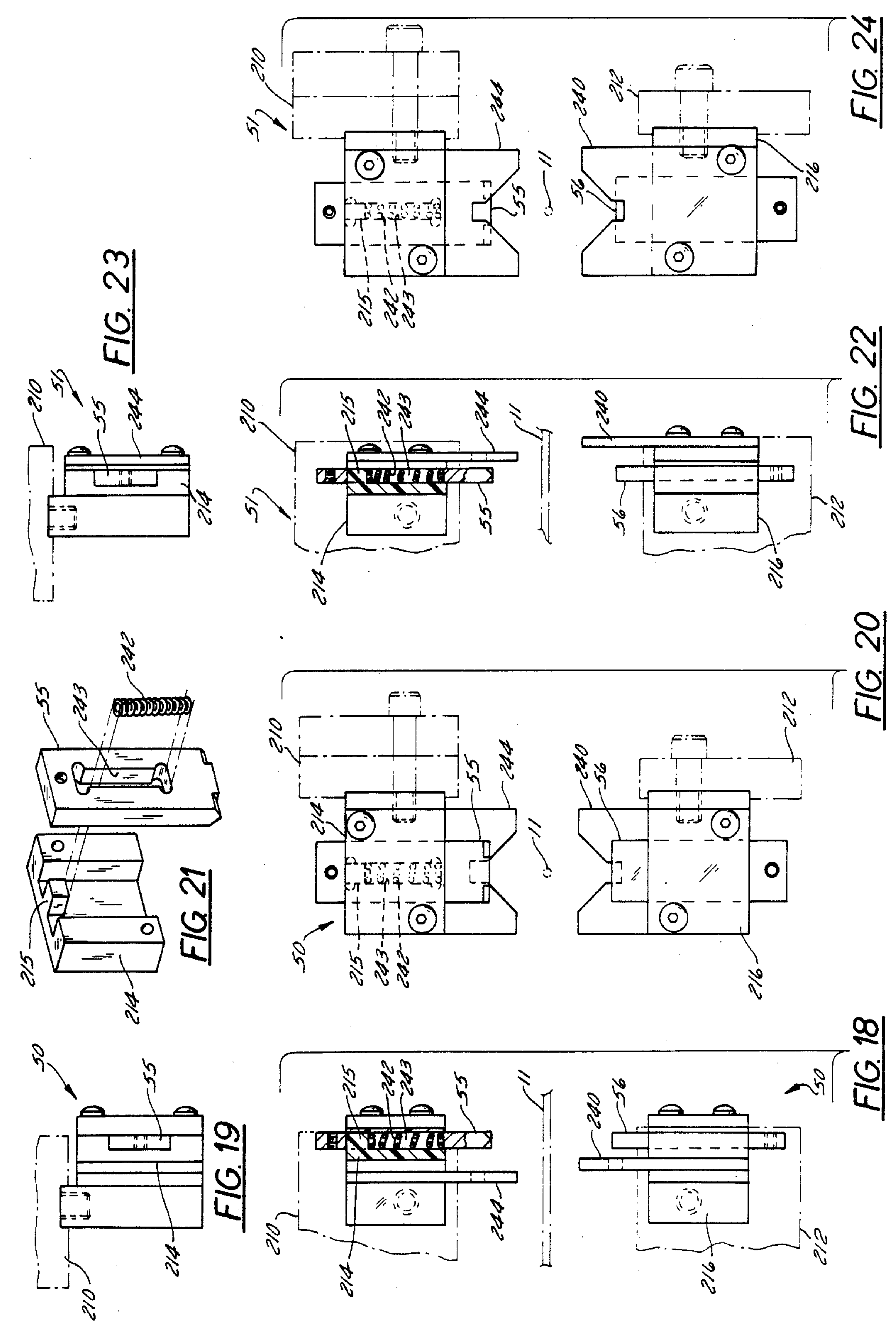
FIG. 18 is an enlarged side elevation view of a first wire position sensing switch.
FIG. 19 is a top plan view of the switch of FIG. 18.
FIG. 20 is an end elevation view of the switch of FIG. 18.
FIG. 21 is an isometric view of the upper portion of the switch of FIGS. 18, 19 and 20.
FIG. 22 is a view similar of FIG. 18 of a second wire position sensing switch.
FIG. 23 is a top plan view of the switch of FIG. 22.
FIG. 24 is an end elevation view of the switch of FIG. 22.

As FIGS. 22, 23 and 24 show, the contacts 55 and 56 for the sensor 51 are mounted in the same manner as for the sensor 50, as above described, except that the V-notched wire guide plates 240 and 244 are mounted on the opposite side of the contacts 55 and 56, respectively. The sensor 51 does not undergo any fore and aft movement relative to the conveyor.

Operation

The equipment shown in FIG. 1 operates as follows. Wire cutter and stripper machine 16 draws wire strand 14 from reel 17 along path P1 and repeatedly cuts segments 11 of desired length therefrom (about 3 feet, for example) and strips the end farthest to the left in FIG. 1. The belt type conveyor 20 receives the wire segments 11 and conveys them in spaced apart relationship and in incremental steps along a path P2 for further processing. As explained, conveyor 20 comprises a driven pair of endless flexible belts 22 and 23 having confronting flights 24 and 25, respectively, which repeatedly separate at their in-feed end and between which the wire segments 11 are inserted and entrapped for transport. Opposite ends of a segment 11 project from opposite sides of conveyor 20, with more projecting from the right side of FIG. 1.

Each wire segment 11 is initially gripped near one end by conveyor 20 until the first terminal attachment machine 31 acts thereon and then is shifted axially (leftward with respect to FIG. 1) in the conveyor 20 by the shifter apparatus in accordance with the invention so that the segment is subsequently gripped near its other end by the conveyor 20 so that the second wire stripper machine 34 and the second terminal attachment machine 35 can act on the other end of the wire segment.

More specifically, the first separator means 35 operates to periodically separate and then reclose the confronting conveyor flights 24 and 25 at a first location between which a wire segment 11 is entrapped to free and enable the wire segment 11 to be axially shifted. The first wire shifter device 36 operates to close its pair of rollers 40 and 41 to entrap and rapidly shift the wire segment axially (leftward in FIG. 1) for a substantial predetermined distance and then the rollers 40 and 41 separate to release the wire segment. As the shifted wire segment 11 exits from between the contacts 55 and 56 in sensor 50 (see FIG. 6), the contacts close and provide a signal which initiates further action. Thus, the sensor 50, which has shifted away from conveyor 20, senses when the wire segment 11 is fully shifted by the first wire shifter device 36 and then effects separation of rollers 40 and 41 to release the wire segment 11 and effects reclosure of the first separator means 35 so that shifted wire segment 11 is again conveyed. The programmable control effects operation of the second separator means 37 to free the previously shifted wire segment 11 for further shifting, and effects operation of the second wire shifter device 38 to precisely position the wire segment 11. The second separator means 37 operates to periodically separate and then reclose the confronting conveyor flights 24 and 25 at a second location between which the previously shifted wire segment 11 is entrapped to free and enable this wire segment 11 to be further shifted axially (leftward in FIG. 1). The second wire shifter device 38 operates its clamp 44 to close and grasp, then slowly axially shift the wire segment 11 for a small distance (leftward in FIG. 1) to precisely position it and then to open the clamp 44 to release the wire segment 11.

It is to be understood that in the foregoing description, the sequence of operation was explained in regard to a single wire segment 11 moving along the path P2. However, in an actual operation where consecutive wire segments are moving along the path P2, the spacing and sequences of operation are such that the separator means 35 and 37 operate simultaneously, although on different wire segments 11. The wire shifter devices 36 and 38 also operate substantially simultaneously, although on different wire segments 11.

We claim:

1. In combination:

conveyor means for conveying an elongated wire segment along a path with the wire axis transverse to said path, said conveyor means including gripping means for releasably gripping said wire segment initially near one end and subsequently near the other end;

means for temporarily releasing said gripping means to enable said wire segment to be shifted axially relative to said conveyor;

shifter means for axially shifting said wire segment while said gripping means are released to enable regripping of said wire segment near said other end;

movable sensing means for sensing when said wire segment has been shifted axially a desired distance and for providing a signal for preventing further shifting by said shifter means, and means to move said sensing means between a first position wherein said sensing means are adapted to initially engage said wire segment at one axial location therealong near said conveyor means and a second position wherein said sensing means are moved away from said conveyor means so as to be able to engage said wire segment at a different axial location therealong from whence said wire segment disengages from said sensing means to provide said signal.

2. A combination according to claim 1 wherein said sensing means comprises a pair of members which are movable relative to each other between open and closed conditions and which are movable between said first position near said conveyor and said second position away from said conveyor;

said members when in said first position being in open condition so as to receive a wire segment therebetween, said members then being actuatable to a closed wire-engaging condition during which they are moved toward said second position, and said members being further actuatable to a closed condition wherein they engage each other when they are in said second position and when said wire segment is withdrawn from therebetween by said shifter means.

3. A combination according to claim 2 wherein said pair of members actuate switch means to provide said signal.

4. A combination according to claim 3 wherein said pair of members comprises switch contacts.

5. A combination according to claim 1 or 2 or 3 or 4 wherein said shifter means comprises first shifter means for rapidly shifting said wire segment a predetermined distance and second shifter means for shifting said wire segment to a precise final position.

6. A combination according to claim 5 wherein said means for temporarily releasing said gripping means comprises first separator means to temporarily release said gripping means at a first location along said path to free said wire segment for axial shifting by said first shifter means, and second separator means to temporarily release said gripping means at a second location along said path to again free said wire segment for further axial shifting by said second shifter means.

7. A combination according to claim 6 wherein said gripping means in said conveyor comprise a driven pair of endless flexible belts having confronting flights between which wire segments are gripped.

8. A combination according to claim 5 wherein said first shifter means comprises a pair of rollers between which a wire segment is entrapped for axial shifting.

9. A combination according to claim 8 wherein said second shifter means comprises a releasable clamp by which a wire segment is gripped for axial shifting.

10. In combination:

conveyor means comprising separable wire gripping means for initially gripping an elongated wire segment near one end and for conveying said wire segment along a path with the wire axis transverse to said path;

first separator means to temporarily separate said wire gripping means at a first location along said path to temporarily free a wire segment for axial shifting;

first shifter means for acially shifting said free wire segment rapidly for a desired distance to a first position whereat said wire gripping means is able to grip the wire segment near its other end;

second separator means to temporarily separate said wire gripping means at a second location along said path to again temporarily free the previously shifted wire segment for further axial shifting;

second shifter means for axially shifting the again freed wire segment to a precise final position whereat said wire gripping means is able to grip the wire segment nearer its other end;

first and second sensing means for sensing when the wire segment has been shifted by said first and second shifter means, respectively, each of said sensing means comprising a pair of members which are movable relative to each other between open and closed conditions, said members when in open condition being able to receive a wire segment therebetween, said members being actuatable to a closed wire-engaging position and being further actuatable to a closed position wherein they engage each other to provide a signal when a wire segment is withdrawn from therebetween by a shifter means, said second sensing means being further movable toward and away from said conveyor, and means to move the pair of members of said first sensor means between one position near said conveyor wherein they open to receive a wire segment therebetween and another position away from said conveyor to which they are moved after a wire segment is therebetween and the members are actuated to closed position.

11. A combination according to claim 10 wherein said gripping means in said conveyor comprise a driven pair of endless flexible belts having confronting flights between which wire segments are gripped.

12. A combination according to claim 11 wherein said first shifter means comprises a pair of rollers between which a wire segment is entrapped for axial shifting.

13. A combination according to claim 12 wherein said second shifter means comprises a releasable clamp by which a wire segment is gripped for axial shifting.

14. A combination according to claim 13 wherein said pair of members in each of said sensing means actuate switch means to provide said signal.

15. A combination according to claim 14 wherein said pair of members comprise switch contacts.

16. A combination according to claim 10 further comprising first means on one side of said conveyor upstream of said first separator means for attaching a terminal to one end of said wire segment;

and second means on the other side of said conveyor downstream of said second shifter means for attaching a terminal to the other end of said wire segment.

17. A combination according to claim 16 further comprising wire stripping means on said other side of said conveyor between said second shifter means and said second means.

18. A combination according to claim 17 further comprising additional wire stripping means upstream of said first separator means.

* * * * *